United States Patent
Ahn et al.

(10) Patent No.: US 6,794,709 B2
(45) Date of Patent: Sep. 21, 2004

(54) STRUCTURE AND METHOD FOR DUAL GATE OXIDE THICKNESSES

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 09/943,324

(22) Filed: Aug. 30, 2001

(65) Prior Publication Data

US 2002/0004276 A1 Jan. 10, 2002

Related U.S. Application Data (62) Division of application No. 09/514,629, filed on Feb. 28, 2000, now Pat. No. 6,297,103.

(51) Int. Cl.[7] .......................................... H01L 29/788
(52) U.S. Cl. .................. 257/315; 257/52; 257/298
(58) Field of Search ........................ 257/36, 52, 298, 257/315, 344, 347, 239, 275, 279, 296, 327, 329, 317; 438/239, 279, 294, 298, 315, 327

(56) References Cited

U.S. PATENT DOCUMENTS

| | | | |
|---|---|---|---|
| 3,789,504 A | | 2/1974 | Jaddam ........................ 29/571 |
| 4,477,310 A | * | 10/1984 | Park et al. |
| 4,700,212 A | * | 10/1987 | Okazawa |
| 5,057,449 A | * | 10/1991 | Lowrey et al. |
| 5,257,095 A | * | 10/1993 | Liu et al. |
| 5,668,035 A | | 9/1997 | Fang et al. .................. 438/239 |
| 5,731,238 A | * | 3/1998 | Cavins et al. |
| 5,960,289 A | | 9/1999 | Tsui et al. .................. 438/275 |
| 5,985,725 A | | 11/1999 | Chou ........................ 438/294 |

(List continued on next page.)

OTHER PUBLICATIONS

Chen, Y., et al., "Performance and Reliability Assessment of Dual–Gate CMOS Devices with Gate Oxide Grown Nitrogen Implanted Si Substrates", *International Electron Device Meeting*, p. 1–4, (1997).

(List continued on next page.)

*Primary Examiner*—Phuc T. Dang
(74) *Attorney, Agent, or Firm*—Schwegman, Lundberg, Woessner & Kluth, P.A.

(57) ABSTRACT

Structures and methods involving at least a pair of gate oxides having different thicknesses, one suitable for use in a logic device and one suitable for use in a memory device, have been shown. The method provided by the present invention affords a technique for ultra thin dual gate oxides having different thicknesses using a low temperature process in which no etching steps are required. The method includes forming a pair of gate oxides to a first thickness, which in one embodiment, includes a thickness of less than 5 nanometers. In one embodiment, forming the pair of gate oxides includes using a low-temperature oxidation method. A thin dielectric layer is then formed on one of the pair of gate oxides which is to remain as a thin gate oxide region for a transistor for use in a logic device. The thin dielectric layer exhibits a high resistance to oxidation at high temperatures. In one embodiment, the thin dielectric layer includes a thin dielectric layer of silicon nitride ($Si_3N_4$) formed using jet vapor deposition (JVD). The other of the pair of gate oxides is then formed to a second thickness to serve as a thick gate oxide region for a transistor for use in a memory device. Another embodiment of the present invention includes the structure of a logic device and a memory device formed on a single substrate as well as systems formed according to the method described above. In one embodiment, a dielectric layer of the transistor for use in the logic device has a thickness of less than 7 nanometers and a dielectric layer in the transistor for use in the memory device has a thickness of less than 12 nanometers.

40 Claims, 4 Drawing Sheets

U.S. PATENT DOCUMENTS

| | | | |
|---|---|---|---|
| 6,087,225 | A | 7/2000 | Bronner et al. ............. 438/275 |
| 6,091,109 | A * | 7/2000 | Hasegawa |
| 6,097,056 | A | 8/2000 | Hsu et al. ................... 257/315 |
| 6,124,171 | A | 9/2000 | Arghavani et al. .......... 438/286 |
| 6,222,788 | B1 | 4/2001 | Forbes et al. .......... 365/230.06 |
| 6,358,819 | B1 | 3/2002 | Shelton et al. ............. 438/433 |
| 6,597,046 | B1 | 7/2003 | Chau et al. ................. 257/411 |

OTHER PUBLICATIONS

Cho, I.H., et al., "Highly Reliable Dual Gate Oxide Fabrication by Reducing Wet Etching Time and Re–Oxidation for Sub–Quarter Micron CMOS Devices", *Extended Abstracts of the 1999 International Conference on Solid State Devices and Materials*, pp. 174–175, (1999).

Crowder, S., et al., "Trade–offs in the Integration of High Performance Devices with Trench Capacitor DRAM", *Dig. Int. Electron Devices Meeting, Washington, D.C.*, pp. 45–48, (Dec. 1997).

Fujiwara, M., et al., "New Optimization Guidelines for Sub–0.1 micrometer CMOS Technologies with 2 micrometer NO Gate Oxynitrides", *1999 Symposium on VLSI Technology Digest of Technical Papers*, pp. 121–122, (1999).

Guo, X., et al., "High Quality Ultra–thin TiO2 Si3N4 Gate Dielectric for Giga Scale MOS Technology", *Technical Digest of 1998 IEDM*, pp. 377–380, (1998).

Han, I.K., et al., "Electrical Characteristics and Reliability of sub–3 nm Gate Oxides Grown on Nitrides Implanted Silicon Substrates", *Int. Electron Devices Meeting*, Washington, D.C., pp. 1–4, (1997).

King, Y., et al., "Sub–5nm Multiple–Thickness Gate Oxide Technology Using Oxygen Implantation", *IEDM Technical Digest*, pp. 585–588, (1998).

Liu, C.T., et al., "Multiple Gate Oxide Thickness for 2GHz System–on–A–Chip Technologies", *IEDM Technical Digest*, pp. 589–592, (1998).

Ma, T.P., "Making Silicon Nitride film a Viable Gate Dielectric", *IEEE Trans. On Electron Devices, 45(3)*, pp. 680–690, (1998).

Muller, D.A., et al., "The Electronic Structure at the Atomic Scale of Ultrathin Gate Oxides", *Nature, 399*, 758–761, (Jun. 1999).

Oi, H., et al., "Dual Gate Oxide Process Integration for High Performance Embedded Memory Products", *Extended Abstracts of the 1998 International Conference on Solid State Devices and Materials*, pp. 108–109, (1998).

Saito, Y., et al., "High–Integrity Silicon Oxide Grown at Low–temperature by Atomic Oxygen Generated in High–Density Krypton Plasma", *Extended Abstracts of the 1999 International Conference on Solid State Devices and Materials*, pp. 152–153, (1999).

Togo, M., et al., "Multiple–Thickness Gate Oxide and Dual–Gate Technologies for High Performance Logic–Embedded DRAms", *IEDM Technical Digest*, pp. 347–350, (1998).

Tseng, H., et al., "Application of JVD Nitride Gate Dielectric to A 0.35 Micron CMOS Process for Reduction of Gate Leakage Current And Boron Penetration", *Int. Electron Device Meeting*, San Francisco, CA, pp. 1–4, (1998).

* cited by examiner

STRUCTURE AND METHOD FOR DUAL GATE OXIDE THICKNESSES

CROSS REFERENCE TO RELATED APPLICATION(S)

This application is a division of U.S. patent application Ser. No. 09/514,629, filed on Feb. 28, 2000, now U.S. Pat. No. 6,297,103 the specification of which is incorporated herein by reference.

FIELD OF THE INVENTION

The present invention relates generally to semiconductor integrated circuits and, more particularly, to structures and methods involving dual gate oxide thicknesses on a single substrate.

BACKGROUND OF THE INVENTION

A high-performance logic circuit with embedded memory devices needs two thicknesses of gate oxide: a thin gate oxide for the logic transistors, or logic MOSFETs, and the other a thick gate oxide for the memory device transistors and/or the high voltage transistors/MOSFETs. These gate oxide films are usually integrated on a wafer through a dual gate oxide (DGO) process.

Historically, dynamic random access memory (DRAM) and logic technologies have evolved along separate but parallel paths. For any particular lithography and power supply voltage level generation, the gate oxide thickness for the DRAM is limited by thin oxide reliability under the stress of voltage boosted word lines. For logic technology, on the other hand, gate oxide thickness is optimized around the need for high transconductance at lower internal operating voltages and therefore these gate oxides are generally thinner. Efforts to merge DRAM and logic onto a single chip to produce a "system on a chip" or other high function DRAM thus must confront the choice of either compromising the gate oxide thickness for one or both device types, or assume the complexity and expense of two separately grown gate oxides. (See generally, S. Crowder et. al., "Trade-offs in the Integration of High Performance Devices with Trench Capacitor DRAM," Int. Electron Devices Meeting (IEDM) Tech. Digest, Washington D.C., paper 2.6, 1997).

Recently, methods have been proposed which allow multiple gate oxide thicknesses to be produced under a single gate conductor by either implanting $Ar^+$ or $N^+$ prior to oxidation. These techniques have been outlined in a paper by S. Crowder et al., entitled "Electrical Characteristics and Reliability of Sub-3 nm Gate Oxides grown on Nitrogen Implanted Silicon Substrates," Int. Electron Devices Meeting (IEDM), Washington D.C., paper 2.6, 1997. Another paper on the topic has been presented by Y. Y. Chen et al., entitled "Performance and Reliability Assessment of Dual-Gate CMOS Devices with Gate Oxide Grown on Nitrogen Implanted Si Substrates," Int. Electron Device Meeting (IEDM), San Francisco, paper 26.4, 1997. Another paper on the subject has been provided by M. Togo et al., entitled "Multiple-Thickness Gate Oxide and Dual-Gate Technologies for High Performance Logic-Embedded DRAMs," Int. Electron Device Meeting (IEDM), San Francisco, paper 13.1, 1998. And, still another paper on the subject has been provided by C. T. Liu et al., entitled "Multiple Gate Oxide Thickness for 2-GHz System-on-a-Chip Technologies," Int. Electron Device Meeting (IEDM), San Francisco, paper 21.2, 1998.

Another method approach has been proposed which allows multiple gate oxide thickness to be produced under a single gate conductor by implanting $O^+$ after gate deposition. (See generally, Y. C. King et al., "Sub-5 μm Multiple-Thickness Gate Oxide Technology Using Oxygen Implantation," Int. Electron Device Meeting (IEDM), San Francisco, paper 21.2, 1998). Another method approach has been proposed for using different crystalline surface orientations. This approach is disclosed in application Ser. No. 09/386,185, by inventors W. Noble and L. Forbes, entitled "Multiple Oxide Thickness for Merged Memory and Logic Applications," filed Aug. 31, 1999.

While these approaches decrease the required process complexity compared to the conventional process integration, they do require the addition of expensive process tools and steps. Clearly there remains a need to provide multiple gate oxide thicknesses on a single chip using existing process steps and little or no added complexity or costs.

In *1998* Oi et al introduced two processes of dual gate oxide formation. (See generally, Hideo Oi et al, "Dual Gate Oxide Process Integration for High Performance Embedded Memory Products," Extended Abstracts of the 1998 International Conference on Solid State Devices and Materials, p. 108–109, 1998). According to these processes, after trench isolation, the well and Vt adjust implantation were the same conditions as for a thin oxide (4 nm) logic baseline process. The single gate oxide wafers were oxidized only once for each oxide thickness (4 nm or 9 nm). Then two different DGO processes were tried. One included a Thick-Thin Process (TTDGO) where the wafer was oxidized for a 9 nm gate oxide first, and the oxide was removed, e.g. etched, from the intended thin-gate regions, and the wafer was reoxidized for a 4 nm gate. The other included a Thin-Thick Process (DGODP). Here, the wafer was oxidized for a 4 nm gate oxide first, followed by the first poly-Si deposition. Then, from the thick gate regions, this combined layer was removed, e.g. etched, and the wafer was reoxidized for a 9 nm gate oxide, followed by the second poly-Si deposition. It should be noted that both processes involve etching of oxide. This etching of the oxides has been shown to be highly detrimental to the reliable operation of these miniature devices.

For example, Cho et al. recently investigated the reliability of dual gate oxides produced from a two-step oxidation and wet etch process. (See generally, I. H. Cho et al., "Highly Reliable Dual Gate Oxide Fabrication by Reducing Wet Etching Time and Re-Oxidation for Sub-Quarter Micron CMOS Devices," Extended Abstracts of the 1999 International conference on Solid State Devices and Materials, p. 174–175, 1999). Their research concluded that the degradation of the thick oxide was due to an increase of oxide surface micro-roughness and thinning at the edges induced by wet etching. They showed the Atomic Force Microscopy (AFM) images of two gate oxides after etching from a 10 nanometer (nm) thickness and from a 5.5 nm to 5 nm thickness. The corresponding rms (root mean square) roughness was 0.81 nm and 0.42 nm, respectively. The top surface of oxide was roughened during the wet etching. For longer time of etching, the rms roughness increased, and the charge to breakdown ($Q_{bd}$) characteristics were degraded. A decrease of etched thickness of gate oxide significantly improved the oxide reliability, and showed the deep sub-quarter micron CMOS transistor without thinning the edges.

Further, in a recent article in Nature (published by the Macmillan Magazines Ltd.) Muller et al. emphasized two fundamental considerations on ultra-thin gate oxides. (See, D. A. Muller et al., "The Electronic Structure at the Atomic Scale of Ultra-Thin Gate Oxides," Nature, vol. 399, p.

753–761, 1999). First, the roughness of the interface must be controlled at an atomic scale. The leakage current through a 1 nm thick oxide increases by about a factor of 10 for every 0.1 nm increase in the rms roughness. This leakage current, in conjunction with the sub-threshold leakage, is the most important figure of merit in a MOSFET. Second, a single layer of silicon and oxygen has the incorrect topology to reproduce the local electronic structure of bulk silicon dioxide.

Thus, there is a need for structures and methods for ultra-thin dual gate oxide thicknesses which do not include an etching process. Furthermore, for giga-scale IC technology lower processing temperatures, using existing process steps with little or no added complexity, are highly desirable.

SUMMARY OF THE INVENTION

The present invention provides structures and methods for ultra-thin dual gate oxides on a single substrate which do not involve an etching step. Further, the ultra-thin dual gate oxides of the present invention utilize existing process steps with little or no added complexity and require lower processing temperatures.

According to one embodiment of the present invention, a method for forming gate oxides on a substrate is provided. The method includes forming a pair of gate oxides to a first thickness on the substrate. For example, in one embodiment, forming the pair of gate oxides to a first thickness includes forming the pair of gate oxides to a thickness of less than 5 nanometers. In one embodiment, forming the pair of gate oxides includes using a low-temperature oxidation method. A thin dielectric layer is then formed on one of the pair of gate oxides which is to remain as a thin gate oxide region for a logic device. The thin dielectric layer exhibits a high resistance to oxidation at high temperatures. In one embodiment, the thin dielectric layer includes a thin dielectric layer of silicon nitride ($Si_3N_4$) formed using jet vapor deposition (JVD). The other of the pair of gate oxides is then formed to a second thickness to serve as a thick gate oxide region for a memory device.

Another embodiment of the present invention includes the structure of a logic device and a memory device formed on a single substrate. The structure includes a first transistor which has a source and a drain region in the substrate separated by a channel region in the substrate. The first transistor includes a dielectric layer of a first thickness separating a gate from the channel region. The dielectric layer of the first thickness has a top layer which exhibits a high resistance to oxidation at high temperatures. The structure includes a second transistor which has a source and a drain region in the substrate separated by a channel region in the substrate. The second transistor includes a dielectric layer of second thickness separating a gate from the channel region. In one embodiment, the first transistor having a dielectric layer of a first thickness includes a dielectric layer having a thickness of less than 7 nanometers such that the first transistor is a transistor for the logic device. In one embodiment, the second transistor having a dielectric layer of second thickness includes a dielectric layer having a thickness of less than 12 nanometers and the second transistor is a transistor for the memory device.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which-the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. The terms wafer and substrate used in the following description include any base semiconductor structure. Both are to be understood as including bulk silicon material, silicon-on-sapphire (SOS) technology, silicon-on-insulator (SOI) technology, thin film transistor (TFT) technology, doped and undoped semiconductors, epitaxial layers of silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure and layer formed above, and the terms wafer or substrate include the underlying layers containing such regions/junctions and layers that may have been formed above. The following detailed description is, therefore, not to be taken in a limiting sense, and the scope of the present invention is defined only by the appended claims. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 1A:
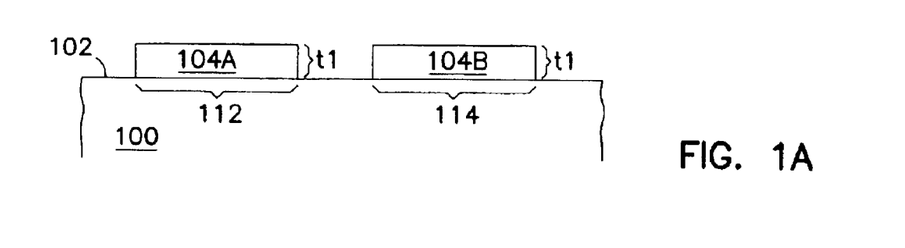
FIGS. 1A–1C, illustrate an embodiment of a process of fabrication of dual gate oxide thicknesses according to the teachings of the present invention.
Figure 1B:
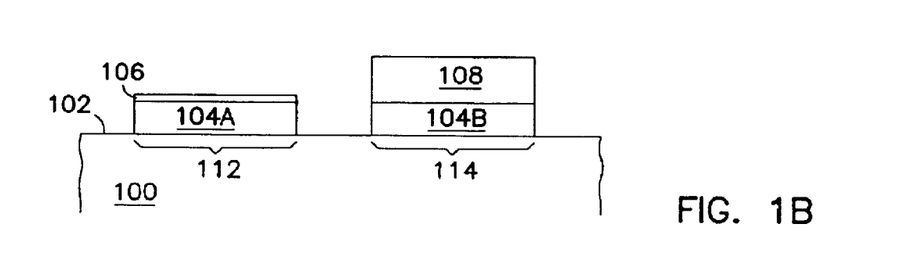
Figure 1C:
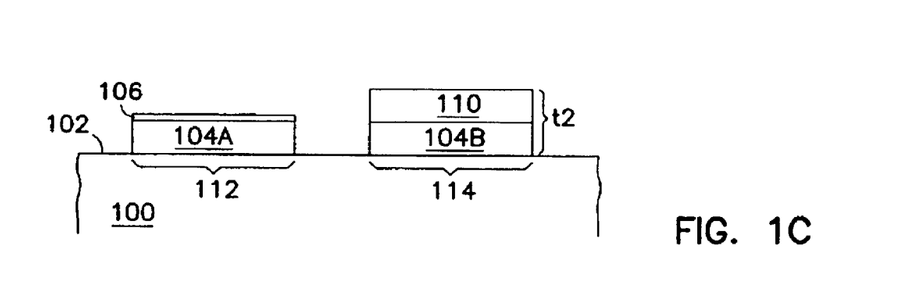

FIGS. 1A–1C illustrate an embodiment of a process of fabrication of dual gate oxide thicknesses according to the teachings of the present invention. As shown in FIG. 1A, the process begins with forming at least a pair of gate oxides 104A and 104B to a first thickness (t1) on the surface 102 of substrate 100. Although forming a pair of gate oxides is presented here, the invention is not so limited and can include forming any number of gate oxides on the surface 102 of the substrate 100. As one of ordinary skill in the art will understand upon reading this disclosure, the manner of forming the pair of gate oxides includes using photolithography techniques to mask portions of the substrate where such gate oxide structures are not desired.

Forming at least a pair of gate oxides 104A and 104B to a first thickness (t1) includes forming at least a pair of gate oxides 104A and 104B where one of the pair 104A is formed in a region intended to serve as a thin gate oxide region, or logic device region 112 and the other of the pair 104B is formed in a region intended to serve as a thick gate oxide region, or memory device region 114.

In one embodiment of the present invention, forming the pair of gate oxides 104A and 104B includes growing the pair of gate oxides 104A and 104B on a silicon substrate 100 using conventional high temperature oxidation as the same is known and understood by one of ordinary skill in the art of semiconductor fabrication. This embodiment produces a pair of gate oxides 104A and 104B comprised of silicon dioxide ($SiO_2$).

In an alternative embodiment of the present invention, forming the pair of gate oxides 104A and 104B includes forming the pair of gate oxides 104A and 104B using a low temperature oxidation method. This low temperature oxidation method includes forming the pair of gate oxides 104A and 104B by a process using atomic oxygen generated in high-density plasma at approximately 400 degrees Celsius. Such a process is described in a paper provided by Y. Saito et al., entitled "High-Integrity Silicon Oxide Grown at Low-Temperature by Atomic Oxygen Generated in High-Density Krypton Plasma," Extended Abstracts of the 1999International Conference on Solid State Devices and Materials, p. 152–153, 1999. This process affords a low temperature combined with a high growth rate. The process further produces an oxide layer having a high dielectric strength and low interface trap and bulk charge. Typical oxidation process parameters in a microwave-excited high-density plasma system and characteristics include: low ion bombardment energy, e.g. less than 7 eV, a high plasma density, e.g. $10^{12}$ ions/cm$^3$, and low electron temperature, e.g. below 1.3 eV. According to this embodiment of the invention, silicon dioxide ($SiO_2$) films were grown by direct oxidation of the silicon surface at 400 degrees Celsius. A mixed gas of 3% oxygen in Krypton (Kr) was used at a pressure of 1 Torr, and the microwave power density was 5 Watts/cm$^2$. A typical growth rate of 15 nanometers in 10 minutes was observed.

According to one embodiment of the present invention, forming the pair of gate oxides 104A and 104B includes forming the pair of gate oxides 104A and 104B to a thickness (t1) of less than 5 nanometers. The structure is now as appears in FIG. 1A.

FIG. 1B illustrates the structure following the next sequence of process steps. In FIG. 1B, a region intended to serve as a thin-gate oxide region 112 is covered with a thin dielectric 106, or thin masking layer 106. The thin dielectric 106, or thin masking layer 106, will become a component of a transistor for a logic device. According to the teachings of the present invention, this includes forming a thin dielectric layer 106 which exhibits a high resistance to oxidation at high temperatures on one of the pair of gate oxides 104A and 104B. In one embodiment of the present invention, forming a thin dielectric layer 106 includes forming a thin dielectric layer 106 of silicon nitride ($Si_3N_4$). In one embodiment, forming a thin dielectric layer 106 includes forming a thin dielectric layer 106 of $Si_3N_4$ to a thickness of less than 3 nanometers deposited by a room-temperature jet vapor deposition (JVD). The JVD process utilizes a high-speed jet of light carrier gas to transport the depositing species onto the substrate to form the desired films. The film composition of typical JVD silicon nitride film has been determined to consist primarily of Si and $N_2$ and with some amounts of O and H. According to the present invention, this thin dielectric layer 106 further exhibits a strong resistance to the formation of an interfacial oxide layer when forming the other of the pair of gate oxides 104A and 104B, e.g. gate oxide 104B, to a second thickness.

According to the teachings of the present invention, this thin dielectric layer 106 further exhibits a high resistance to boron penetration at high temperatures. As used in this disclosure, high temperatures are considered to be temperatures above approximately 200 degrees Celsius. Thus, high temperature further include temperatures above 800 degrees Celsius. As one of ordinary skill in the art will understand upon reading this disclosure, forming the thin dielectric layer 106 on one of the pair of gate oxides 104A and 104B in a region intended to serve as a thin-gate oxide region 112 includes suitable photolithography techniques to mask other portions of the substrate 100 and regions such as the other of the pair of gate oxides 104A and 104B which are intended to become thick gate oxide regions 114. One of ordinary skill in the art upon reading this disclosure will know and understand the same, including the manner in which a photoresist mask can be applied and subsequently removed. An illustration is provided in FIG. 1B of such a mask layer 108, e.g. a photoresist mask 108, covering a region, i.e. one of the pair of gate oxides 104A and 104B, in a thick-gate oxide region where the thick gate oxide will become a component of a transistor for a memory device. The structure is now as appears in FIG. 1B.

FIG. 1C illustrates the structure following the next sequence of process steps. In FIG. 1C, the other of the pair of gate oxides 104A and 104B, e.g. gate oxide 104B, in a gate oxide region 114 intended to serve as a thick-gate oxide region, is grown to a second thickness (t2). In other words, the other of the pair of gate oxides 104A and 104B discussed in connection with FIGS. 1A and 1B is formed to a second thickness (t2). The other of the pair of gate oxides 104B with its new oxide layer 110 having a second thickness (t2) as will become a component of a transistor for a memory device. In one embodiment of the present invention, forming the other of the pair of gate oxides 104A and 104B to a second thickness includes growing the other of the pair of gate oxides 104A and 104B, e.g. gate oxide 104B in region 114 to a second thickness (t2) using conventional high temperature oxidation as the same is known and understood by one of ordinary skill in the art of semiconductor fabrication. The second gate oxide thickness (t2) includes the original or first thickness of the gate oxide layer 104B formed previously and the newly formed oxide layer 110 formed thereon. Thus, the second gate oxide thickness (t2) is comprised entirely of silicon dioxide ($SiO_2$).

In an alternative embodiment of the present invention, forming the other of the pair of gate oxides 104A and 104B to a second thickness includes forming the other of the pair of gate oxides 104A and 104B, e.g. gate oxide 104B in region 114, to a second thickness (t2) using a low temperature oxidation method. This low temperature oxidation method includes forming the other of the pair of gate oxides 104A and 104B, e.g. gate oxide 104B in region 114 to a second thickness (t2) through a process using atomic oxygen generated in high-density plasma at approximately 400 degrees Celsius. This process produces the second layer of oxide 110 on the gate oxide layer of the first thickness 104B such that oxide layer 104B and oxide layer 110 constitute a gate oxide layer having a second thickness (t2) suitable for use in a transistor for a memory device.

In one embodiment according to the teachings of the present invention, forming the other of the pair of gate oxides 104A and 104B, e.g. gate oxide 104B in region 114 to a second thickness (t2) includes forming the other of the pair of gate oxides 104A and 104B, e.g. gate oxide 104B in region 114 to a second thickness (t2) of less than 12 nanometers (nm). In another embodiment, forming the other of the pair of gate oxides 104A and 104B, e.g. gate oxide 104B in region 114 to a second thickness (t2) includes forming this gate oxide to a thickness of approximately 10 nm using the low temperature oxidation method. The structure is now as appears in FIG. 1C.

Thus, a method of forming at least a pair of gate oxides having different thicknesses, one suitable for use in a logic device and one suitable for use in a memory device, has been shown. The method provided by the present invention affords a technique in which no etching steps are required as part of the oxide formation process. Also, the methods taught by the present invention produce ultra thin dual gate oxides having different thicknesses using a low temperature process. Both the thin and thick oxides are grown on the virgin silicon surface 100, which maintains the original, atomically smooth surface.

As one of ordinary skill in the art will understand upon reading this disclosure, the fabrication steps illustrated in FIGS. 1A–1C can be continued as part of a method for fabricating a circuit having logic and memory devices on a single substrate including wiring the logic device to the memory device using a metallization process to implement a specific circuit function. The details of such continuing fabrication steps are not described in detail here so as not to obscure the invention of forming the ultra thin gate oxides on a single substrate in a streamlined, low temperature process to have different thicknesses without requiring etching steps. The process steps required to form gates, such as boron doped polysilicon gates, on the ultra thin gate oxides having different thickness will be recognized by one of ordinary skill in the art of semiconductor fabrication upon reading this disclosure. Likewise, the steps necessary to create source and drain regions in the substrate separated by a channel region in the substrate, e.g. steps such as implant doping, will further be understood by one of ordinary skill in the art of semiconductor fabrication upon reading this disclosure. The metallization techniques which can be used to complete a circuit having logic and memory devices on a single substrate to implement a specific circuit function will also be understood by one of ordinary skill in the art of semiconductor fabrication upon reading this disclosure. Again, for those reasons, the same is not listed in detail herein.

One of ordinary skill in the art will understand that the forming of gate oxides on a substrate comprises part of a process for forming a number of transistors on the substrate and that forming a thin gate oxide, or dielectric, in a thin gate oxide region will comprise part of forming a first transistor for application in a logic device. Similarly, forming a thick gate oxide, or dielectric, in a thick gate oxide region will comprise part of forming a second transistor for application in a memory device.

Figure 2:
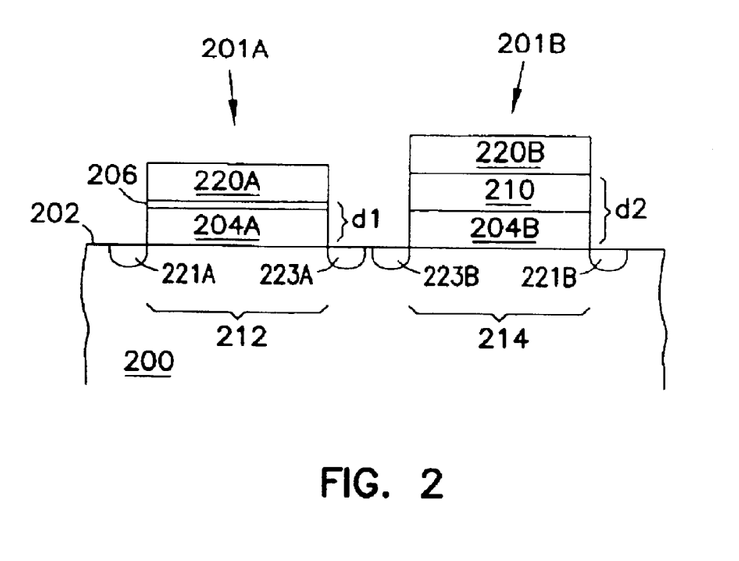
FIG. 2 illustrates an embodiment of a structure having a transistor for use as a logic transistor and a transistor for use as a memory transistor formed on a single substrate according to the teachings of the present invention.

As can be understood from viewing FIG. 2, a first transistor 201A formed in thin gate oxide region 212 for use in a logic device has a total dielectric layer of a first thickness, d1. Also as seen from viewing FIG. 2 a second transistor 201B formed in the thick gate oxide region 214 for use in a memory device has a total dielectric layer of a second thickness, d2, which is greater than the dielectric layer of the first thickness, d1. The first transistor having a dielectric layer of a first thickness d1 includes a bottom layer 204A of silicon dioxide ($SiO_2$) and a top layer 206 of silicon nitride ($Si_3N_4$). The second transistor having a dielectric layer of a second thickness d2 includes a bottom layer 204B of silicon dioxide (SiO2) and an additional top layer 210 of silicon dioxide (SiO2). In one embodiment, the first transistor having a dielectric layer of a first thickness dl includes a dielectric layer of a first thickness d1 which is less than 7 nanometers (nm). In this embodiment, the second transistor having a dielectric layer of a second thickness d2 includes a dielectric layer of a second thickness d2 which is less than 12 nm. In one embodiment, the first transistor having a diclectric layer of a first thickness d1 includes a dielectric layer of a first thickness d1 having a top layer 206 which exhibits a high resistance to oxidation at high temperatures. In one embodiment, the first transistor having a dielectric layer of a first thickness d1 has a top layer of silicon nitride ($Si_3N_4$) which comprises approximately a third of the first thickness d1 of the dielectric layer. In one embodiment, the first transistor 201A further includes a gate 220A, a first source/drain region 221A and a second source drain region 223A. In one embodiment. the second transistor 201B further includes a gate 220B, a first source/drain region 221B and a second source drain region 223B.

Figure 3:
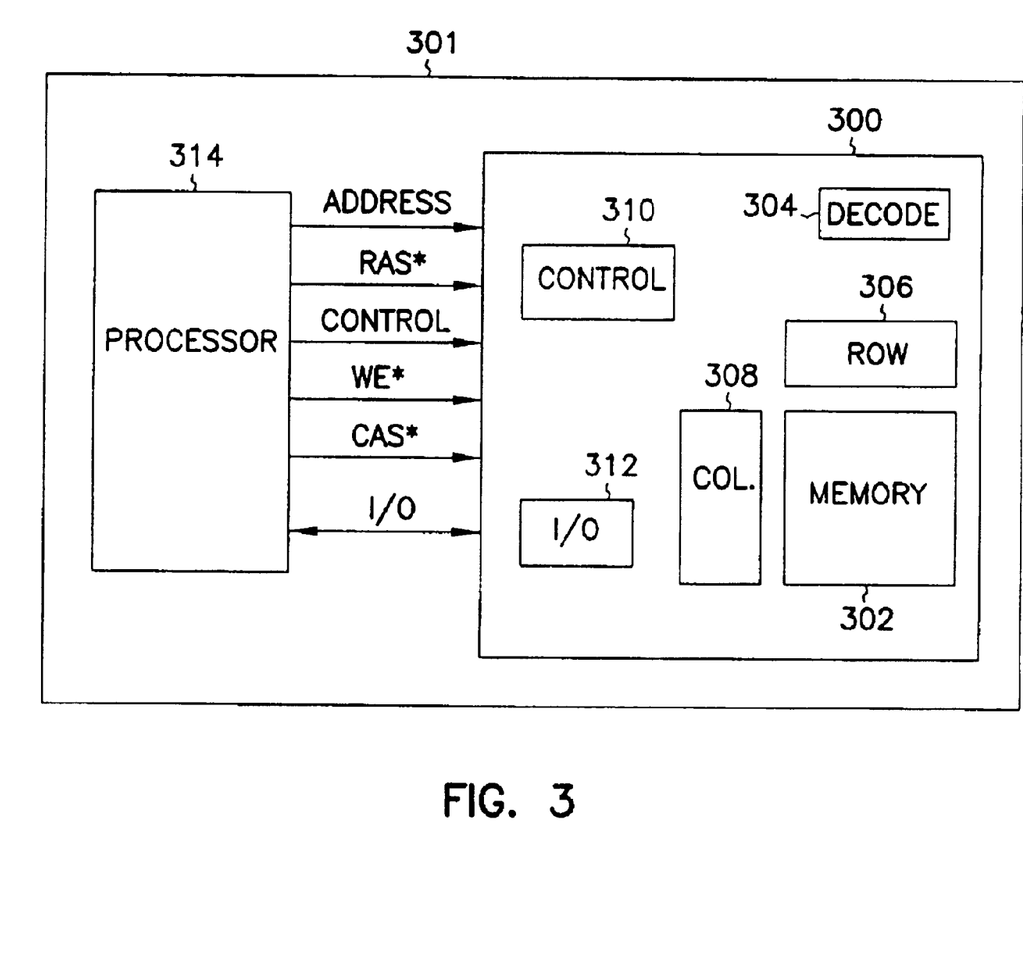
FIG. 3 illustrates an embodiment of a circuit on a single substrate including a logic device and a memory device according to the teachings of the present invention.

FIG. 3 illustrates a block diagram of an embodiment of a circuit on a single substrate 301, or a system on a chip 301 including a logic device and a memory device according to the teachings of the present invention. In the embodiment shown in FIG. 3, the circuit, or system 301 includes a memory device 300 which has an array of memory cells 302, address decoder 304, row access circuitry 306, column access circuitry 308, control circuitry 310, and input/output circuit 312. Also, as shown in FIG. 3, the circuit 301 includes a processor 314, or memory controller for memory accessing. The memory device 300 receives control signals from the processor 314, such as WE*, RAS* and CAS* signals over wiring or metallization lines. The memory device 300 is used to store data which is accessed via I/O lines. It will be appreciated by those skilled in the art that additional circuitry and control signals can be provided, and that the memory device 300 has been simplified to help focus on the invention. At least one of the memory cells 302 has a transistor including a gate oxide, or dielectric layer, in accordance with the aforementioned embodiments. Similarly, at least one of the logic components of the circuit, i.e. the processor 314, includes a transistor having a gate oxide, or dielectric layer, in accordance with the aforementioned embodiments.

It will be understood that the embodiment shown in FIG. 3 illustrates an embodiment for the circuitry of a Dynamic Random Access Memory (DRAM) formed on a single substrate according to the teachings of the present invention. The illustration of a circuit or system 301 as shown in FIG. 3 is intended to provide a general understanding of one application for the structure and circuitry of the present invention, and is not intended to serve as a complete description of all the elements and features of a DRAM. Further, the invention is equally applicable to any size and type of memory circuit 301 and is not intended to be limited to the DRAM described above. Other alternative types of circuits which can use the structure of the present invention include Static Random Access Memory (SRAM) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies.

As recognized by those skilled in the art, circuits of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Other circuits containing the dielectric layer structure described in this disclosure include circuitry for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Figure 4:
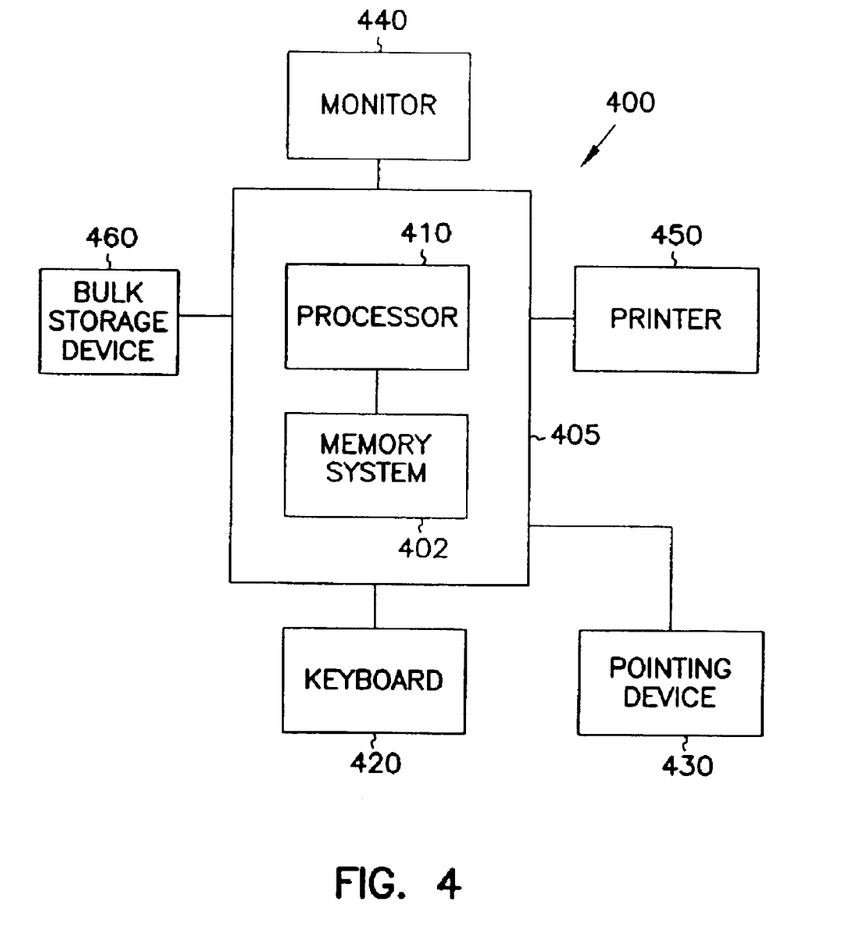
FIG. 4 illustrates a system according to the teachings of the present invention.

FIG. 4 illustrates a system, e.g. an electronic system, according to the teachings of the present invention. System 400 contains a processor 410 and a memory system 402 housed in a computer unit 405. According to the teachings of the present invention, a logic transistor for the processor and a memory transistor for the memory system can be formed on a single substrate with appropriate ultra thin dielectric layer components. That is, the processor 410 contains at least one transistor having a dielectric layer formed according to the teachings of the present invention. The memory system 402 includes memory cells. At least one of the memory cells includes a transistor having a dielectric layer, or gate oxide formed according to the teachings of the present invention. System 400 is but one example of an electronic system containing another electronic system, e.g., memory system 402, as a subcomponent. System 400 optionally contains user interface components. These user interface components include devices such as a keyboard 420, a pointing device 430, a monitor 440, a printer 450, and a bulk storage device 460. It will be appreciated that other components are often associated with system 400 such as modems, device driver cards, additional storage devices, etc. It will further be appreciated from reading the present disclosure that the processor 410 and memory system 402 of system 400 can be incorporated on a single integrated circuit such that dual gate oxide thicknesses are formed according to the teachings of the present invention as necessary for a transistor in a memory cell and as necessary for a transistor in the processor. Such single-package processing units reduce the communication time between the processor and the memory circuit.

Conclusion

Thus, structures and methods for at least a pair of gate oxides having different thicknesses, one suitable for use in a logic device and one suitable for use in a memory device, have been shown. The structures and methods provided by the present invention affords a solution which avoids the need for etching steps as part of the gate oxide, or dielectric formation process. Also, the structures and methods taught by the present invention provide better performance ultra thin gate oxides where the gate oxides can be produced having different thicknesses using a low temperature process.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A logic circuit and a memory circuit structure on a single substrate, comprising:
    a first transistor having a source and a drain region in the substrate separated by a channel region in the substrate, wherein the first transistor includes a dielectric layer of a first thickness, including a top layer which exhibits higher resistance to oxidation than the substrate material, separating a gate from the channel region; and
    a second transistor having a source and a drain region in the substrate separated by a channel region in the substrate, wherein the second transistor includes a dielectric layer of second thickness different from the first thickness, separating a gate from the channel region.

2. The structure of claim 1, wherein the first transistor is a transistor for the logic device and the second transistor is a transistor for the memory device.

3. The structure of claim 1, wherein the first transistor having a dielectric layer of a first thickness includes a dielectric layer having a thickness of less than 7 nanometers.

4. The structure of claim 1, wherein the first transistor having a dielectric layer of a first thickness includes a bottom layer of silicon dioxide ($SiO_2$) and a top layer of silicon nitride ($Si_3N_4$).

5. The structure of claim 1, wherein the second transistor having a dielectric layer of second thickness includes a dielectric layer formed entirely of silicon dioxide ($SiO_2$).

6. The structure of claim 1, wherein the second transistor having a dielectric layer of second thickness includes a dielectric layer having a thickness of less than 12 nanometers.

7. The structure of claim 1, wherein the first transistor which includes a dielectric layer of a first thickness and having a top layer includes a top layer of silicon nitride ($Si_3N_4$) which comprises approximately a third of the first thickness of the dielectric layer.

8. The structure of claim 1, wherein the first transistor which includes a dielectric layer of a first thickness includes a dielectric layer having a thickness of less than 7 nanometers, wherein the dielectric layer has a bottom layer of silicon dioxide ($SiO_2$), and wherein the top layer is silicon nitride ($Si_3N_4$).

9. A logic circuit and a memory circuit structure on a single substrate, comprising:
    a first transistor, wherein the first transistor includes:
        a first dielectric layer of a first thickness less than 5 nanometers (nm);
        a top layer which exhibits higher resistance to oxidation than the substrate material; and
    a second transistor, wherein the second transistor includes a second dielectric layer of a second thickness different from the first thickness.

10. The structure of claim 9, wherein the first dielectric layer and the top layer together have a thickness of less than 7 nanometers (nm).

11. The structure of claim 9, wherein first dielectric layer of a first thickness includes silicon dioxide ($SiO_2$) and the top layer includes silicon nitride ($Si_3N_4$).

12. The structure of claim 9, wherein the second dielectric layer of a second thickness includes a dielectric layer formed entirely of silicon dioxide ($SiO_2$).

13. The structure of claim 9, wherein the second dielectric layer of a second thickness includes a dielectric layer having a thickness of less than 12 nanometers.

14. The structure of claim 9, wherein the top layer includes a top layer of silicon nitride (Si3N4) which comprises approximately a third of the first thickness of the first dielectric layer.

15. The structure of claim 9, wherein the top layer exhibits a higher resistance to boron penetration than the substrate material.

16. A logic circuit and a memory circuit structure on a single substrate, comprising:
   a first transistor, wherein the first transistor includes:
      a first dielectric layer of a first thickness less than 5 nanometers (nm);
      a top layer which exhibits a higher resistance to boron penetration than the substrate material; and
   a second transistor, wherein the second transistor includes a second dielectric layer of a second thickness different from the first thickness.

17. The structure of claim 16, wherein the first dielectric layer and the top layer together have a thickness of less than 7 nanometers (nm).

18. The structure of claim 16, wherein first dielectric layer of a first thickness includes silicon dioxide (SiO2) and the top layer includes silicon nitride (Si3N4).

19. The structure of claim 16, wherein the second dielectric layer of a second thickness includes a dielectric layer formed entirely of silicon dioxide (SiO2).

20. The structure of claim 16, wherein the second dielectric layer of a second thickness includes a dielectric layer having a thickness of less than 12 nanometers.

21. A logic circuit and a memory circuit structure on a single substrate, comprising:
   a first transistor, wherein the first transistor includes:
      a first dielectric layer of a first thickness less than 5 nanometers (nm);
      a silicon nitride (Si3N4) top layer which exhibits higher resistance to oxidation than the substrate material; and
   a second transistor, wherein the second transistor includes a second dielectric layer of a second thickness different from the first thickness.

22. The structure of claim 21, wherein the first dielectric layer and the top layer together have a thickness of less than 7 nanometers (nm).

23. The structure of claim 21, wherein the second dielectric layer of a second thickness includes a dielectric layer formed entirely of silicon dioxide (SiO2).

24. The structure of claim 21, wherein the second dielectric layer of a second thickness includes a dielectric layer having a thickness of less than 12 nanometers.

25. The structure of claim 21, wherein the silicon nitride (Si3N4) top layer includes a silicon nitride (Si3N4) top layer with a thickness of approximately a third of the first thickness of the first dielectric layer.

26. The structure of claim 21, wherein the top layer exhibits a higher resistance to boron penetration than the substrate material.

27. A logic circuit and a memory circuit structure on a single substrate, comprising:
   a first transistor, wherein the first transistor includes:
      a first dielectric layer of a first thickness less than 5 nanometers (nm);
      a top layer of approximately a third of the first thickness, which exhibits higher resistance oxidation than the substrate material; and
   a second transistor, wherein the second transistor includes a second dielectric layer of a second thickness different from the first thickness.

28. The structure of claim 27, wherein the top layer exhibits a higher resistance to boron penetration than the substrate material.

29. The structure of claim 27, wherein the first dielectric layer and the top layer together have a thickness of less than 7 nanometers (nm).

30. The structure of claim 27, wherein the second dielectric layer of a second thickness includes a dielectric layer formed entirely of silicon dioxide (SiO2).

31. The structure of claim 27, wherein the second dielectric layer of a second thickness includes a dielectric layer having a thickness of less than 12 nanometers.

32. A logic circuit and a memory circuit structure on a single substrate, comprising:
   a first transistor, wherein the first transistor includes:
      a first dielectric layer of a first thickness less than 5 nanometers (nm);
      a top layer which exhibits higher resistance to oxidation than the substrate material; and
   a second transistor, wherein the second transistor includes a second dielectric layer of a second thickness different from the first thickness, wherein the second thickness is less than 12 nanometers (nm).

33. The structure of claim 32, wherein the top layer exhibits a higher resistance to boron penetration than the substrate material.

34. The structure of claim 32, wherein the first dielectric layer and the top layer together have a thickness of less than 7 nanometers (nm).

35. The structure of claim 32, wherein the second dielectric layer of a second thickness includes a dielectric layer formed entirely of silicon dioxide (SiO2).

36. A logic circuit and a memory circuit structure on a single substrate, comprising:
   a first transistor, wherein the first transistor includes:
      a first dielectric layer of a first thickness less than 5 nanometers (nm);
      a silicon nitride (Si3N4) top layer of approximately a third of the first thickness, which exhibits higher resistance to oxidation than the substrate material; and
   a second transistor, wherein the second transistor includes a second dielectric layer of a second thickness different from the first thickness, wherein the second thickness is less than 12 nanometers (nm).

37. The structure of claim 36, wherein the top layer exhibits a higher resistance to boron penetration than the substrate material.

38. The structure of claim 36, wherein the first dielectric layer and the top layer together have a thickness of less than 7 nanometers (nm).

39. The structure of claim 36, wherein the second dielectric layer of a second thickness includes a dielectric layer formed entirely of silicon dioxide (SiO2).

40. A logic circuit and a memory circuit structure on a single substrate formed by the method comprising:
   forming a pair of transistor channel regions on the single substrate;
   forming a pair of gate oxides to a first thickness on the pair of channel regions;
   wherein forming the pair of gate oxides to a first thickness includes forming the pair of gate oxides to a thickness of less than 5 nanometers (nm) by krypton plasma generated atomic oxygen;
   forming a dielectric layer on one of the pair of gate oxides, wherein the dielectric layer exhibits higher resistance to oxidation than the substrate material; and forming the other of the pair of gate oxides to a second thickness different from the first thickness.

* * * * *

UNITED STATES PATENT AND TRADEMARK OFFICE
CERTIFICATE OF CORRECTION

PATENT NO.    : 6,794,709 B2
DATED         : September 21, 2004
INVENTOR(S)   : Ahn et al.

It is certified that error appears in the above-identified patent and that said Letters Patent is hereby corrected as shown below:

Title page,
Item [56], References Cited, U.S. PATENT DOCUMENTS, "4,477,310 A", reference, after "Park et al." insert -- 156 --.
"4,700,212 A", reference, after "Okazawa" insert -- 357 --.
"5,057,449 A", reference, after "Lowrey et al." insert -- 438 --.
"5,257,095 A", reference, after "Liu et al." insert -- 257 --.
"5,731,238 A", reference, after "Cavins et al." insert -- 438 --.
"6,091,109 A", reference, after "Hasegawa" insert -- 257 --.
OTHER PUBLICATIONS, "Guo, X., et al.", reference, delete "TiO2 Si3N4" and insert -- $TiO_2$ $Si_3N_4$ --, therefor.
After "Han, I.K., et al.", reference, insert -- Hideo, O., et al., "Dual Gate Oxide Process Integration for High Performance Embedded Memory Products", Extended Abstract of the 1998 International Conference on Solid State Devices and Materials, pp. 108-109, (1998) --.
"Togo, M., et al.", reference, delete "DRAms" and insert -- DRAMs --, therefor.

Column 5,
Line 40, delete "1999International" and insert -- 1999 International --, therefor.

Column 8,
Lines 14 and 15, delete "SiO2" and insert -- $SiO_2$ --, therefor.
Lines 30 and 33, delete "source drain" and insert -- source/drain --, therefor.

Column 10,
Lines 28, 32, 45, 60 and 64, delete "SiO2" and insert -- $SiO_2$ --, therefor.
Lines 29, 39, 46 and 61, delete "Si3N4" and insert -- $Si_3N_4$ --, therefor.

Column 11,
Lines 21, 25 and 44, delete "SiO2" and insert -- $SiO_2$ --, therefor.
Lines 22, 34 and 49, delete "Si3N4" and insert -- $Si_3N_4$ --, therefor.
Line 49, after "nitride" delete "(Si3N4)" and insert -- ($Si_3N_4$) --, therefor.

UNITED STATES PATENT AND TRADEMARK OFFICE
CERTIFICATE OF CORRECTION

PATENT NO.   : 6,794,709 B2
DATED        : September 21, 2004
INVENTOR(S)  : Ahn et al.

It is certified that error appears in the above-identified patent and that said Letters Patent is hereby corrected as shown below:

<u>Column 12,</u>
Lines 6, 29 and 50, delete "SiO2" and insert -- $SiO_2$ --, therefor.
Line 35, delete "Si3N4" and insert -- $Si_3N_4$ --, therefor.

Signed and Sealed this

Tenth Day of May, 2005

JON W. DUDAS
*Director of the United States Patent and Trademark Office*